(12) United States Patent
Hasan et al.

(10) Patent No.: US 12,726,144 B2
(45) Date of Patent: Sep. 1, 2026

(54) CONTROL CIRCUIT FOR A DIRECT CURRENT MOTOR

(71) Applicant: GM Global Technology Operations LLC, Detroit, MI (US)

(72) Inventors: S.M. Nayeem Hasan, Novi, MI (US); Nicholas Logan Harvell, Brownstown, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 82 days.

(21) Appl. No.: 18/600,007

(22) Filed: Mar. 8, 2024

(65) Prior Publication Data

US 2025/0286485 A1 Sep. 11, 2025

(51) Int. Cl.

| | |
|---|---|
| ***H01H 47/00*** | (2006.01) |
| ***B60S 1/08*** | (2006.01) |
| ***H02P 3/08*** | (2006.01) |
| ***H02P 7/28*** | (2016.01) |
| ***H03K 17/041*** | (2006.01) |

(52) U.S. Cl.
CPC ................ *H02P 7/28* (2013.01); *B60S 1/08* (2013.01); *H02P 3/08* (2013.01); *H03K 17/04106* (2013.01)

(58) Field of Classification Search
CPC .................................... H02P 7/28; H02P 3/08
See application file for complete search history.

(56) References Cited

U.S. PATENT DOCUMENTS 6,960,896 B1 * 11/2005 Shu .......................... H02P 7/29 318/434
7,012,387 B1 * 3/2006 Guo ....................... H02P 7/285 318/770
9,584,059 B2 * 2/2017 Reynolds ................. H02P 6/10
2011/0204728 A1 * 8/2011 Belz .................... H02H 11/003 340/815.45

FOREIGN PATENT DOCUMENTS

DE 10045633 A1 4/2002
DE 102008059226 B4 12/2010
WO WO-2019149989 A1 8/2019

* cited by examiner

*Primary Examiner* — Muhammad S Islam
(74) *Attorney, Agent, or Firm* — Honigman LLP; Matthew H. Szalach; Jonathan P. O'Brien

(57) ABSTRACT

A control circuit operatively attached to a motor is provided. The motor includes a first input and a second input and is configured to operate at a first speed and a second speed. The control circuit includes a first speed switch unit configured to connect the battery to the first input, a second speed switch unit configured to connect the battery to the second input, the second speed switch unit configured to block a current generated from a back electromotive force of the motor, and a braking switch unit interposed between the second speed switch unit and the second input, the braking switch unit configured to connect the motor to a ground to stop the motor from operating. The control circuit further including a free-wheeling diode and a discharge diode configured to dissipate and discharge inductive current generated by the motor.

20 Claims, 6 Drawing Sheets

102
110
106
108
106
100
10
104

10
12
14a
14b
14c
16
18
100
M
26
28
20
20d
20g
20s
20c
20bd
20a
104
VSYS
High Speed Output
Low Speed Output
30
N-A
N-B
N-C
N-D
36
36c
36a
38
38c
38a
22a-a
22a-bd
22a-c
22a-d
22b-c
22b-bd
22b-a
22a-s
22a-g
22, 22a
22b-g
22b-d
22, 22b
22b-s
24a
24c
24bd
24s
24d
24g
24
32
34

10
12
14a
14b
14c
16
18
100
M
26
28
High Side Gate Driver
High Speed Output
Low Speed Output
20
20d
20g
20s
20c
20bd
20a
N-C
30
36
36c
36a
104
VSYS
N-D
38
38c
38a
22a-a
22a-bd
22a-c
22a-d
22b-c
22b-bd
22b-a
24a
24c
24bd
24s
22a-s
22a-g
22, 22a
22b-d
22b-g
22, 22b
22b-s
N-B
24d
24g
24
34
32
N-A 10
12
14a
14b
14c
16
18
100
104
VSYS
M
High Speed Output
Low Speed Output
20
20d
20g
20s
20c
20bd
20a
22a-a
22a-bd
22a-c
22a-d
22b-c
22b-bd
22b-a
22a-s
22a-g
22, 22a
22b-d
22b-g
22, 22b
22b
22b-s
24a
24c
24bd
24s
24d
24g
24
26
28
30
32
34
36
36c
36a
38
38c
38a
N-A
N-B
N-C
N-D 10
12
14a
14b
14c
N-A
32
34
22, 22a
22a-g
22a-s
22a-a
22a-bd
22a-c
22a-d
22, 22b
22b-g
22b-d
22b-s
22b-c
22b-bd
22b-a
N-B
24
24g
24d
24s
24a
24c
24bd
VSYS
104
20
20d
20g
20s
20c
20bd
20a
28
N-C
N-D
38
38c
38a
36
36c
36a
30
High Speed Output
Low Speed Output
26
18
16
100
M

CONTROL CIRCUIT FOR A DIRECT CURRENT MOTOR

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates generally to control circuit for a direct-current ("DC") motor. The motor may be a windshield wiper motor having three brushes and configured to operate at two different speeds such as a low speed and a high speed. The motor may generate an electromotive force at one brush output that may back feed current to another brush resulting in reduced motor speed and efficiency. The motor may also generate inductive voltage spikes that may damage the circuit components operatively connected to the motor. The electromotive force, voltage spike, and/or back feed current may occur at a low speed brush while running at high speed or during DC motor commutation, or when power supply to the motor is disrupted.

Accordingly, it is desirable to have a control circuit configured to achieve desired speed as well as to protect the electric components by blocking the back feed current, and clamping inductive voltage spikes generated by the operation of the motor.

SUMMARY

In one configuration, a control circuit operatively attached to a motor control unit configured to control an operation of a motor is provided. The motor is powered by a battery and includes a first input and a second input and is configured to operate at a first speed and a second speed different than the first speed. The control circuit includes a first speed switch unit, a second speed switch unit and a braking switch unit. The first speed switch unit is disposed on a first communication line and is configured to connect the battery to the first input. The second speed switch unit is disposed on a second communication line and is configured to connect the battery to the second input. The second speed switch unit is further configured to block a current generated from a back electromotive force of the motor. The braking switch unit is connected to the second communication line and is interposed between the second input and a ground. The braking switch unit is configured to connect the motor to a ground, thereby stopping an operation of the motor.

The control circuit may include one or more of the following optional features. For example, the first speed switch unit may be a semiconductor switch and the second speed switch unit may include a first switch and a second switch, wherein the first switch and the second switch are a semiconductor, and a polarity of the first switch is the opposite of a polarity of the second switch.

In one configuration, the first switch is interposed between the battery and the second switch. In such a configuration, the first switch may include a first diode and an anode of the first diode is interposed between the battery and a cathode of the first diode and the second switch includes a second diode and an anode of the second diode is interposed between a cathode of the second diode and the motor.

In one configuration, the control circuit further includes a free-wheeling diode that is connected to the first communication line and is connected in parallel with the motor. The free-wheeling diode is configured to dissipate current through the second input of the motor.

In one configuration, the control circuit further includes a discharge diode disposed on the second communication line and interposed between the braking switch unit and the motor. The discharge diode may be configured to clamp and discharge current at a predetermined voltage. The discharge diode may be a transient-voltage-suppression diode.

In another configuration, a control circuit for controlling an operation of a two-speed motor having three brushes is provided. The two-speed motor includes a first input and a second input and is configured to operate at a first speed and a second speed different than the first speed. The two-speed motor is powered by a battery and a microcomputer is configured to transmit a brake command to stop the operation of the two-speed motor. The control circuit includes a first speed switch unit, a second speed switch unit and a braking switch unit. The first speed switch unit is disposed on a first communication line and is configured to connect the battery to the first input. The second speed switch unit is disposed on a second communication line and is configured to connect the battery to the second input. The second speed switch unit includes a first switch and a second switch, wherein a polarity of the first switch is the opposite of a polarity of the second switch. The braking switch unit is connected to the second communication line and interposed between the second speed switch unit and the second input. The braking switch unit is configured to connect the two-speed motor to a ground to stop an operation of the two-speed motor. The control circuit further includes a free-wheeling diode and a discharge diode. The free-wheeling diode is connected to the first communication line and is in parallel with the two-speed motor. The free-wheeling diode is configured to dissipate current through the first input of the two-speed motor. The discharge diode is disposed on the second communication line and is interposed between the braking switch unit and the two-speed motor. The discharge diode is configured to discharge current at a predetermined voltage to protect the braking switch unit from a voltage surge of the two-speed motor.

The control circuit may include one or more of the following optional features. For example, the first speed switch unit, the first switch, and the second switch are a semiconductor switch each operatively connected to a high side gate driver.

In one configuration, the first switch includes a first diode and an anode of the first diode is interposed between the battery and a cathode of the first diode and wherein the second switch includes a second diode and an anode of the second diode is interposed between a cathode of the second diode and the two-speed motor.

In one configuration, the discharge diode is a transient-voltage-suppression diode.

In another configuration, a control circuit operatively coupled to a motor control unit configured to generate control signals for an operation of a windshield wiper motor, the control signals including a low-speed command, a high-speed command, and a brake command. The windshield wiper motor is powered by a battery and includes three brushes and is configured to operate at a low speed when the low-speed command is transmitted, a high speed when the high-speed command is transmitted, and brake when the brake command is transmitted. The windshield wiper motor includes a first input for receiving the high-speed command and a second input for receiving the low-speed command and the brake command. The control circuit includes a first speed switch unit, a second speed switch unit, and a braking switch unit. The first speed switch unit is disposed on a first communication line and is configured to connect the battery to the first input when the high-speed command is transmitted. The second speed switch unit is disposed on a second communication line and is configured to connect the battery to the second input when the low-speed command is transmitted. The second speed switch unit includes a first switch and a second switch, wherein a polarity of the first switch is the opposite of a polarity of the second switch. The braking switch unit is connected to the second communication line and is interposed between the second input and a ground. The braking switch unit is configured to ground the windshield wiper motor when the brake command is received and stop the windshield wiper motor from rotating. The control circuit further includes a free-wheeling diode and a discharge diode. The free-wheeling diode is connected to the first communication line and is in parallel with the windshield wiper motor. The free-wheeling diode is configured to dissipate current through the first input of the windshield wiper motor. The discharge diode is disposed on the second communication line and is in parallel with the windshield wiper motor. The discharge diode is configured to discharge current at a predetermined voltage to protect the braking switch unit from a voltage surge of the windshield wiper motor, and wherein one of the braking switch unit and the discharge diode are further configured to dissipate current along the second communication line.

In one configuration, the first speed switch unit, first switch and the second switch are a semiconductor. The first switch may be interposed between the battery and the second switch. In such a configuration, the first speed switch unit, the first switch, the second switch and the braking switch unit are a semiconductor switch. The first speed switch unit, the first switch, and the second switch are each operatively connected to a high side gate driver and the braking switch unit is operatively connected to a low side gate driver. The first switch may include a first diode and an anode of the first diode is interposed between the battery and a cathode of the first diode and wherein the second switch includes a second diode, and an anode of the second diode is interposed between a cathode of the second diode and the windshield wiper motor.

In one configuration, the discharge diode is a transient-voltage-suppression diode.

BRIEF DESCRIPTION OF THE DRAWINGS

The drawings described herein are for illustrative purposes only of selected configurations and are not intended to limit the scope of the present disclosure.

Corresponding reference numerals indicate corresponding parts throughout the drawings.

DETAILED DESCRIPTION

Figure 1:
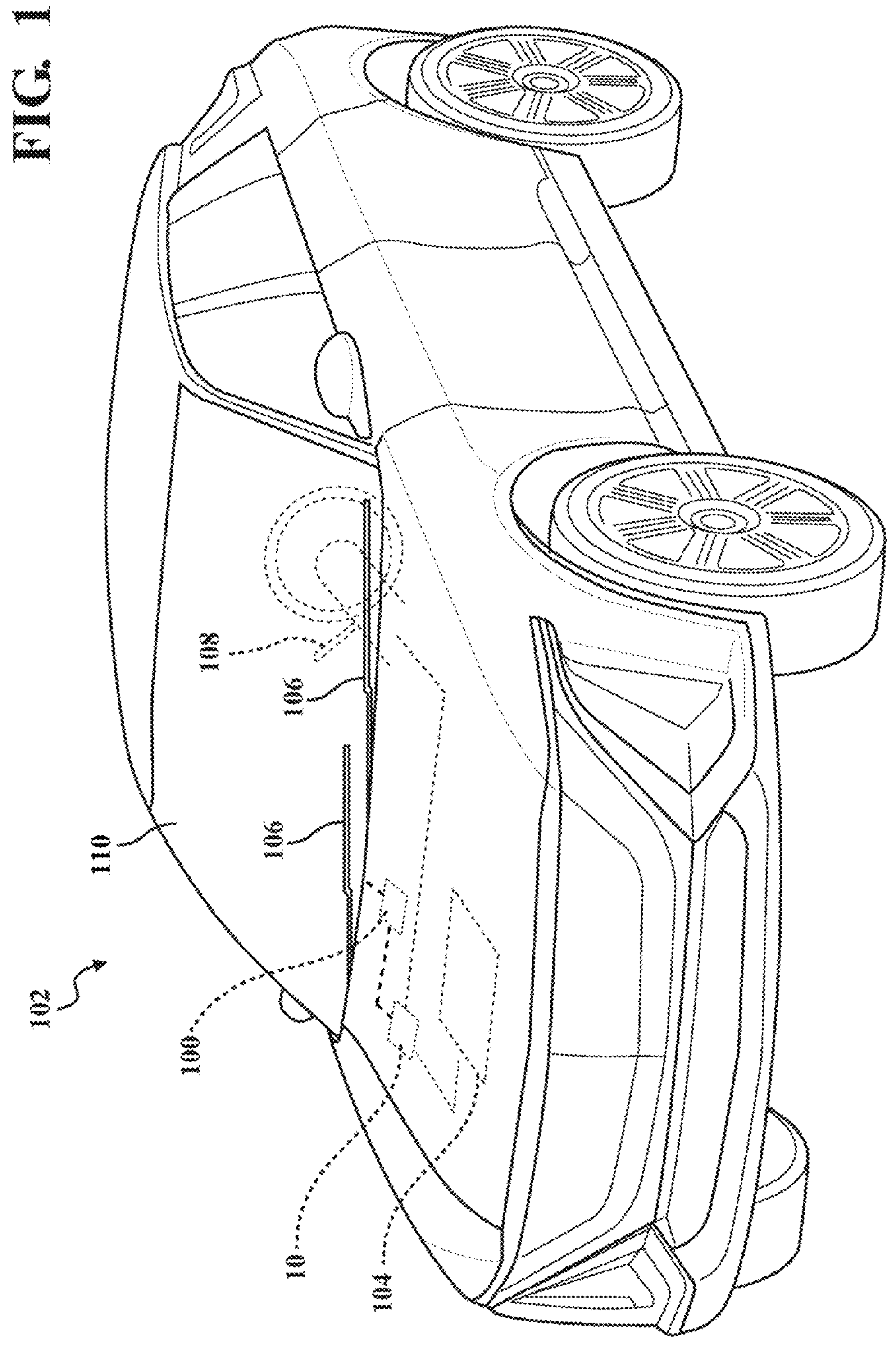
FIG. 1 is a perspective view of an automotive vehicle having a windshield wiper and a motor operatively attached to the windshield wiper.

Example configurations will now be described more fully with reference to the accompanying drawings. Example configurations are provided so that this disclosure will be thorough, and will fully convey the scope of the disclosure to those of ordinary skill in the art. Specific details are set forth such as examples of specific components, devices, and methods, to provide a thorough understanding of configurations of the present disclosure. It will be apparent to those of ordinary skill in the art that specific details need not be employed, that example configurations may be embodied in many different forms, and that the specific details and the example configurations should not be construed to limit the scope of the disclosure.

The terminology used herein is for the purpose of describing particular exemplary configurations only and is not intended to be limiting. As used herein, the singular articles "a," "an," and "the" may be intended to include the plural forms as well, unless the context clearly indicates otherwise. The terms "comprises," "comprising," "including," and "having," are inclusive and therefore specify the presence of features, steps, operations, elements, and/or components, but do not preclude the presence or addition of one or more other features, steps, operations, elements, components, and/or groups thereof. The method steps, processes, and operations described herein are not to be construed as necessarily requiring their performance in the particular order discussed or illustrated, unless specifically identified as an order of performance. Additional or alternative steps may be employed.

When an element or layer is referred to as being "on," "engaged to," "connected to," "attached to," or "coupled to" another element or layer, it may be directly on, engaged, connected, attached, or coupled to the other element or layer, or intervening elements or layers may be present. In contrast, when an element is referred to as being "directly on," "directly engaged to," "directly connected to," "directly attached to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The terms "first," "second," "third," etc. may be used herein to describe various elements, components, regions, layers and/or sections. These elements, components, regions, layers and/or sections should not be limited by these terms. These terms may be only used to distinguish one element, component, region, layer or section from another region, layer or section. Terms such as "first," "second," and other numerical terms do not imply a sequence or order unless clearly indicated by the context. Thus, a first element, component, region, layer or section discussed below could be termed a second element, component, region, layer or section without departing from the teachings of the example configurations.

In this application, including the definitions below, the term "module" may be replaced with the term "circuit." The term "module" may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term "code," as used above, may include software, firmware, and/or microcode, and may refer to programs, routines, functions, classes, and/or objects. The term "shared processor" encompasses a single processor that executes some or all code from multiple modules. The term "group processor" encompasses a processor that, in combination with additional processors, executes some or all code from one or more modules. The term "shared memory" encompasses a single memory that stores some or all code from multiple modules. The term "group memory" encompasses a memory that, in combination with additional memories, stores some or all code from one or more modules. The term "memory" may be a subset of the term "computer-readable medium." The term "computer-readable medium" does not encompass transitory electrical and electromagnetic signals propagating through a medium, and may therefore be considered tangible and non-transitory memory. Non-limiting examples of a non-transitory memory include a tangible computer readable medium including a nonvolatile memory, magnetic storage, and optical storage.

The apparatuses and methods described in this application may be partially or fully implemented by one or more computer programs executed by one or more processors. The computer programs include processor-executable instructions that are stored on at least one non-transitory tangible computer readable medium. The computer programs may also include and/or rely on stored data.

A software application (i.e., a software resource) may refer to computer software that causes a computing device to perform a task. In some examples, a software application may be referred to as an "application," an "app," or a "program." Example applications include, but are not limited to, system diagnostic applications, system management applications, system maintenance applications, word processing applications, spreadsheet applications, messaging applications, media streaming applications, social networking applications, and gaming applications.

The non-transitory memory may be physical devices used to store programs (e.g., sequences of instructions) or data (e.g., program state information) on a temporary or permanent basis for use by a computing device. The non-transitory memory may be volatile and/or non-volatile addressable semiconductor memory. Examples of non-volatile memory include, but are not limited to, flash memory and read-only memory (ROM)/programmable read-only memory (PROM)/erasable programmable read-only memory (EPROM)/electronically erasable programmable read-only memory (EEPROM) (e.g., typically used for firmware, such as boot programs). Examples of volatile memory include, but are not limited to, random access memory (RAM), dynamic random access memory (DRAM), static random access memory (SRAM), phase change memory (PCM) as well as disks or tapes.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" and "computer-readable medium" refer to any computer program product, non-transitory computer readable medium, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

Various implementations of the systems and techniques described herein can be realized in digital electronic and/or optical circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

The processes and logic flows described in this specification can be performed by one or more programmable processors, also referred to as data processing hardware, executing one or more computer programs to perform functions by operating on input data and generating output. The processes and logic flows can also be performed by special purpose logic circuitry, e.g., an FPGA (field programmable gate array) or an ASIC (application specific integrated circuit). Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, one or more aspects of the disclosure can be implemented on a computer having a display device, e.g., a CRT (cathode ray tube), LCD (liquid crystal display) monitor, or touch screen for displaying information to the user and optionally a keyboard and a pointing device, e.g., a mouse or a trackball, by which the user can provide input to the computer. Other kinds of devices can be used to provide interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

A control circuit for controlling the operation of a motor, such as a windshield wiper motor is provided. The control circuit is configured to dissipate inductive voltage surges generated by the motor during various operating parameters of the motor.

With reference to FIG. 1 a control circuit 10 for use with a motor 100 is provided. For illustrative purposes, the control circuit 10 is explained in the context of a windshield wiper motor 100 of an automotive vehicle 102. The windshield wiper motor 100 is powered by a battery 104 and is mechanically coupled to a pair of windshield wipers 106. The control circuit 10 is operatively attached to a motor control unit 12 that is configured to transmit control signals to operate the windshield wiper motor 100 at different speeds.

Figure 2:
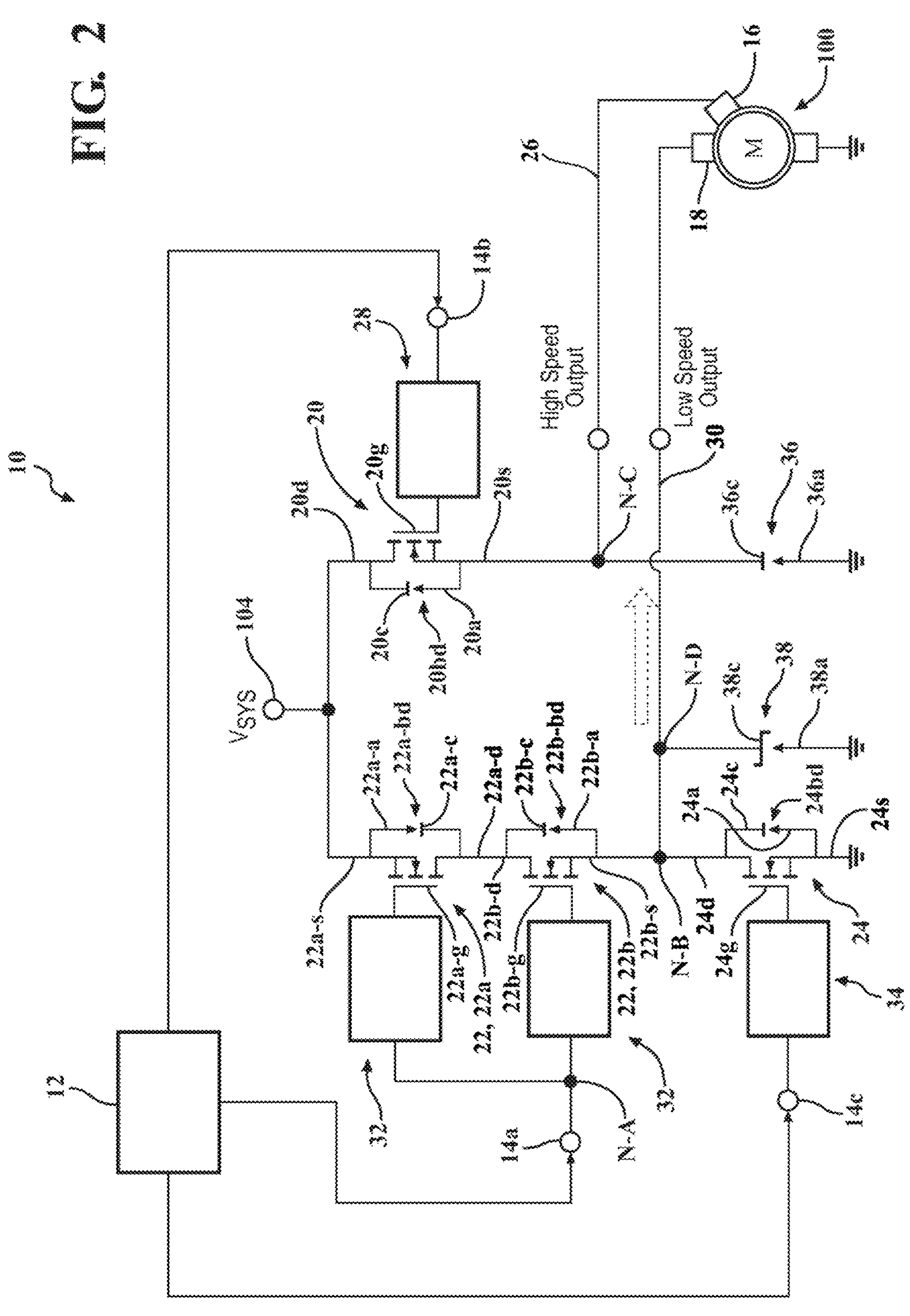
FIG. 2 is a schematic view of a control circuit.

With reference now to FIG. 2, a schematic view of the control circuit 10 is provided. The control circuit 10 is communicatively connected to the motor control unit 12 and receives control signals 14*a*, 14*b*, 14*c* from the motor control unit 12 to actuate the windshield wipers 106. The control signals 14*a*, 14*b*, 14*c* include a low-speed command 14*a*, a high-speed command 14*b*, and a braking command 14*c*, which when received by the control circuit 10, causes the windshield wiper motor 100 to operate at a low speed, a high speed and perform braking as the case may be.

The windshield wiper motor 100 may be a two-speed direct current (DC) motor 100 having at least three brushes. The windshield wiper motor 100 includes a first input 16 and a second input 18. The first input 16 is configured to receive the high-speed command 14*b* for operating the windshield wiper motor 100 at a high speed, and the second input 18 is configured to receive the low-speed command 14*a* for operating the windshield wiper motor 100 at a low speed. The second input 18 is further configured to receive a brake command 14*c* configured to ground the windshield wiper motor 100 and stop the operation of the windshield wiper motor 100. It should be appreciated that the motor control unit 12 may be configured to transmit an intermittent signal to pause the operation of the windshield wiper motor 100 while operating at low speed and a high speed, in which case the sweeping motion of the windshield wipers 106 is performed at a respective low and high speed but is paused at either a bottom of the sweep and/or a top of the sweep.

The control circuit 10 may be assembled onto a printed circuit board (not shown) and housed in a casing (not shown) which is electrically connected to the battery 104 and the motor 100 through an electric bus, wire harness or a combination thereof (not shown). The motor control unit 12 may be mounted to the printed circuit board in combination with the control circuit 10 or housed remotely and connected to the control circuit 10 by an electric bus or wire harness. The control circuit 10 includes a first speed switch unit 20, a second speed switch unit 22 and a braking switch unit 24. The first speed switch unit 20 is disposed on a first communication line 26 which connects the battery 104 to the first input 16 of the windshield wiper motor 100. In the case where the control circuit 10 is disposed on a printed circuit board, the first communication line 26 may be a portion of a printed trace of the printed circuit board and a wire harness coupling the first speed switch unit 20 to the first input 16. The first speed switch unit 20 is operable to turn on and off, wherein when the first speed switch unit 20 is turned on power is supplied from the battery 104 to the first input 16 of the windshield wiper motor 100 and the windshield wiper motor 100 operates at a high speed. When the first speed switch is turned off an open circuit is formed and, thus, power from the battery 104 to the windshield wiper motor 100 is disconnected.

The first speed switch unit 20 may be a semiconductor switch. Any semiconductor switch currently known or later developed may be modified for use herein. For illustrative purposes, the first speed switch unit 20 is shown as a MOSFET semiconductor. In such an aspect, the first speed switch unit 20 includes a gate 20*g*, a source 20*s*, a drain 20*d* and a body diode 20*bd* interposed between the source 20*s* and the drain 20*d*. The cathode 20*c* of the body diode 20*bd* is directly connected to the drain 20*d* of the first speed switch unit 20 and the anode 20*a* of the body diode 20*bd* is directly connected to the source 20*s*. As such, current is allowed to flow along the body diode 20*bd* from the source 20*s* to the drain 20*d*. The gate 20*g* of the first speed switch unit 20 is operatively connected to a first high side gate driver 28. The first high side gate driver 28 may include a charge pump (not shown) to increase the voltage at the gate 20*g* of the first speed switch unit 20 as needed to turn on the first speed switch unit 20.

The second speed switch unit 22 is disposed on a second communication line 30 which connects the battery 104 to the second input 18 of the windshield wiper motor 100. The second speed switch unit 22 is operable to turn on and off, wherein when the second speed switch unit 22 is turned on power is supplied from the battery 104 to the second input 18 of the windshield wiper motor 100 and the windshield wiper motor 100 operates at a low speed. When the second speed switch unit 22 is turned off an open circuit is formed and, thus, power from the battery 104 to the windshield wiper motor 100 is disconnected. The second speed switch unit 22 is further configured to block a current generated from a back electromotive force of the motor 100.

The second speed switch unit 22 may include a first switch 22*a* and a second switch 22*b* which are connected in series along the second communication line 30 and are connected in parallel at node "N-A." The first switch 22*a* is interposed between the battery 104 and the second switch 22*b* to provide power from the battery 104 to the second switch 22*b*.

The first switch 22*a* and the second switch 22*b* may be a semiconductor switch. Any semiconductor switch currently known or later developed may be modified for use herein. For illustrative purposes, the first switch 22*a* and the second switch 22*b* are shown as a MOSFET semiconductor. In such an aspect, the second switch 22*b* includes a gate 22*b-g*, a source 22*b-s*, a drain 22*b-d* and a body diode 22*b-bd* interposed between the source 22*b-s* and the drain 22*b-d*. The cathode 22*b-c* of the body diode 22*b-bd* of the second switch 22*b* is directly connected to the drain 22*b-d* of the second switch 22*b* and the anode 22*b-a* of the body diode 22*b-bd* of the second switch 22*b* is directly connected to the source 22*b-s* of the second switch 22*b*, as such current is allowed to flow along the body diode 22*b-bd* from the source 22*b-s* to the drain 22*b-d*. The anode 22*a-a* of the body diode 22*a-bd* of the first switch 22*a* is directly connected to the source 22*a-s* of the first switch 22*a* and the cathode 22*a-c* of the body diode 22*a-bd* of the first switch 22*a* is directly connected to the drain 22*a-d*, as such current is blocked from flowing along the body diode 22*a-bd* of the first switch 22*a* from the drain 22*a-d* to the source 22*a-s*. In other words, the first switch 22*a* has a polarity that is the opposite of the polarity of the second switch 22*b*. The gate 22*a-g* of the first switch 22*a* and the gate 22*b-g* of the second switch 22*b* is operatively connected to a second high side gate driver 32. The second high side gate driver 32 may include a charge pump (not shown) to increase the voltage at the gate of the MOSFET as needed to turn on the MOSFET semiconductor. It should be appreciated that the specifications of the first high side gate driver 28 and the second high side gate driver 32 may be similar in instances where the operating specifications of the first speed switch unit 20 and the second speed switch unit 22 are similar, or that the second high side gate driver 32 operatively coupled to the first switch 22*a* may have different operating specifications relative to the second high side gate driver 32 operatively coupled to the second switch 22*b*.

The braking switch unit 24 is connected to the second communication line 30 at node "N-B" and is interposed between the second speed switch unit 22 and the second input 18 of the windshield wiper motor 100. The braking switch unit 24 is configured to turn on and off. When the braking switch is turned off an open circuit is formed below node "N-B." When the braking switch is turned on, an electric path is made to a ground thereby connecting the windshield wiper motor 100 to ground and stopping an operation of the windshield wiper motor 100.

The braking switch unit 24 may be a semiconductor switch. Any semiconductor switch currently known or later developed may be modified for use herein. For illustrative purposes, the braking switch unit 24 is shown as a MOSFET semiconductor. In such an aspect, the braking switch unit 24 includes a gate 24*g*, a source 24*s*, a drain 24*d* and a body diode 24*bd* interposed between the source 24*s* and the drain 24*d*. The cathode 24*c* of the body diode 24*bd* faces the drain 24*d* of the braking switch unit 24 and the anode 24*a* of the body diode 24*bd* is directly connected to the source 24*s*. As such, current is allowed to flow along the body diode 24*bd* from the source 24*s* to the drain 24*d*. The gate 24*g* of the braking switch unit 24 is operatively connected to a low side gate driver 34. The low side gate driver 34 is configured to provide a steady voltage to the gate 24*g* of the braking switch unit 24 to turn on the braking switch unit 24 and connect the windshield wiper motor 100 to ground.

The control circuit 10 may further include a free-wheeling diode 36 that is connected to the first communication line 26 and is connected in parallel with the windshield wiper motor 100 at node "N-C." The free-wheeling diode 36 is configured to dissipate current through the first input 16 of the motor 100. The cathode 36*c* of the free-wheeling diode 36 faces and is directly connected to the first speed switch unit 20 and the anode 36*a* of the free-wheeling diode 36 is directly connected to ground and allows a current to flow in a direction from the anode 36*a* to the cathode 36*c*.

The control circuit 10 further includes a discharge diode 38 connected to the second communication line 30 at node "N-D" and interposed between the braking switch unit 24 and the motor 100. The discharge diode 38 includes a cathode 38*c* directly connected to and facing Node "N-D" and the anode 38*a* is directly connected to ground configured to clamp and discharge current at a predetermined voltage to ground. The discharge diode 38 may be a transient-voltage-suppression diode.

With reference now to FIGS. 1-6, an operation of the control circuit 10 is provided. The motor control unit 12 may be coupled to an interface 108 on the automotive vehicle 102 configured to turn on and off the windshield wipers 106 and operate the windshield wipers 106 at different speeds, e.g. a low speed and a high speed. For instance, the interface 108 may be a rod pivotably mounted to a steering column of the automotive vehicle 102 that may be pivoted between an off position, a low-speed position, and a high-speed position, wherein the position of the rod is transmitted to the motor control unit 12 to operate the windshield wiper motor 100 in an off mode, a low-speed mode, and a high-speed mode. Accordingly, it should be understood that when it is described that the windshield wipers 106 are in a low-speed mode, a high-speed mode, or turned off, the interface 108 is positioned to select one of the modes and the motor control unit 12 processes the position of the interface 108 to actuate the selected mode. This may be performed any interface 108 currently known or later developed, illustratively including a dial, a touch screen, or physical buttons.

With reference now to FIG. 2, the windshield wiper motor 100 is operated in a low-speed mode, wherein the motor control unit 12 transmits a low-speed command 14*a* to the second high-side gate drivers 32 operatively connected to the gates 22*a-g*, 22*b-g* of a respective first switch 22*a* and second switch 22*b*. The second high-side gate drivers 32 apply a voltage to the respective gates 22*a-g*, 22*b-g* to turn on the first switch 22*a* and the second switch 22*b*. When the first switch 22*a* and the second switch 22*b* are turned on, voltage from the battery 104 is supplied along the second communication line 30 to the second input 18 of the windshield wiper motor 100 and the windshield wipers 106 are actuated at a low speed, as indicated by the dashed arrow.

Figure 3:
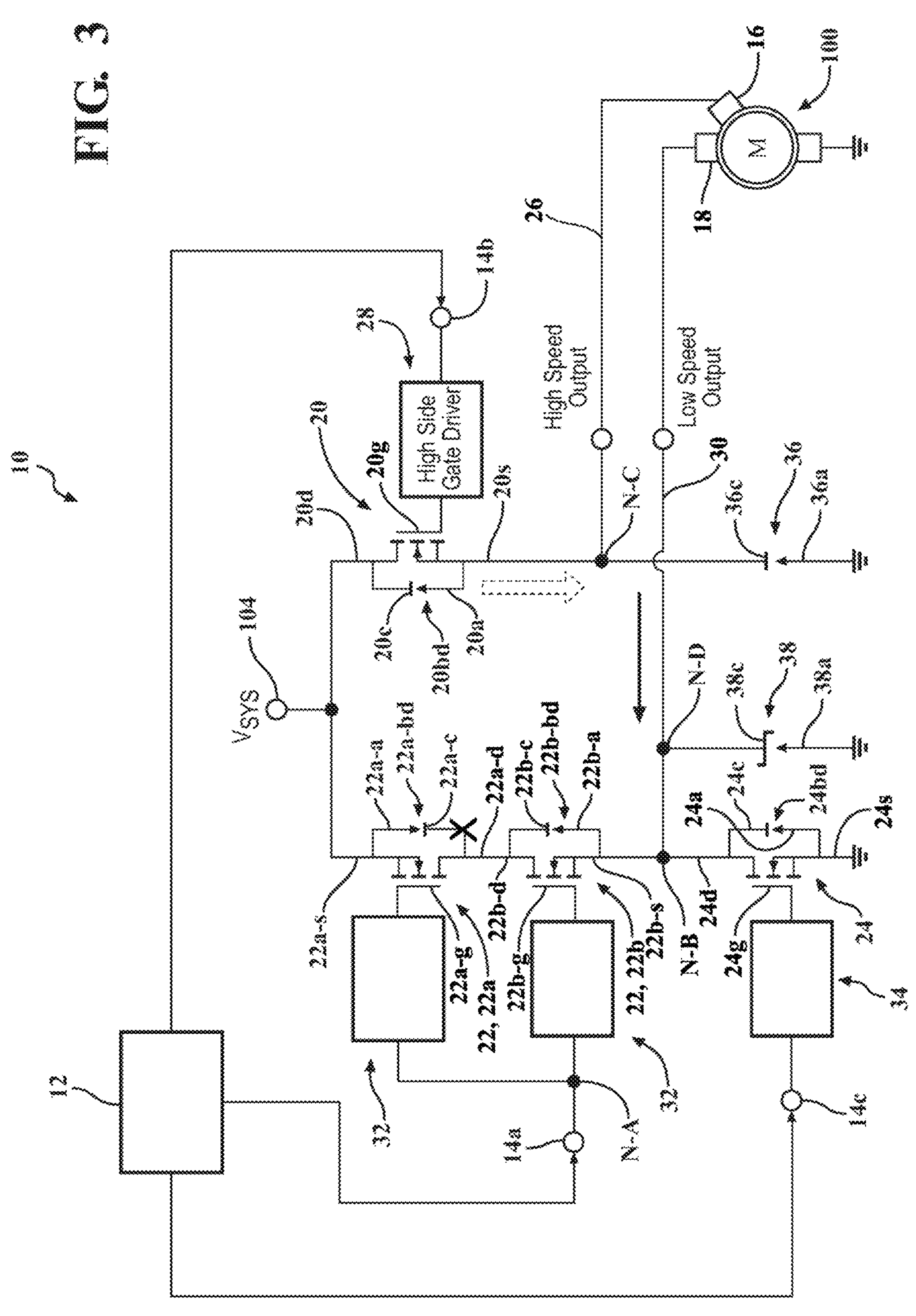
FIG. 3 is schematic view of the control circuit shown in FIG. 2 showing the first speed switch unit turned on and the second speed switch unit turned off.

With reference now to FIG. 3, when the windshield wipers 106 are operated in a high-speed mode, the motor control unit 12 turns off the second speed switch unit 22, and turns on the first speed switch unit 20. When the first speed switch unit 20 is turned on, power is supplied from the battery 104 to the first input 16 as indicated by the dashed arrow. During the operation of the windshield wiper motor 100, the back electromotive force from the motor 100 may generate a voltage higher than the battery 104 resulting in a current flowing out of the motor 100 through the second input 18 along the second communication line 30 (as indicated by the solid arrow). When the second speed switch unit 22 is turned off, the body diode of the second switch 22*b* is configured to allow the back current to flow through the second switch 22*b*. However, the back current is blocked by the body diode of the first switch 22*a*, as indicated by the "X." As such, the back current is prevented from being introduced back into the windshield wiper motor 100 and degrading the operation of the windshield wiper motor 100.

Figure 4:
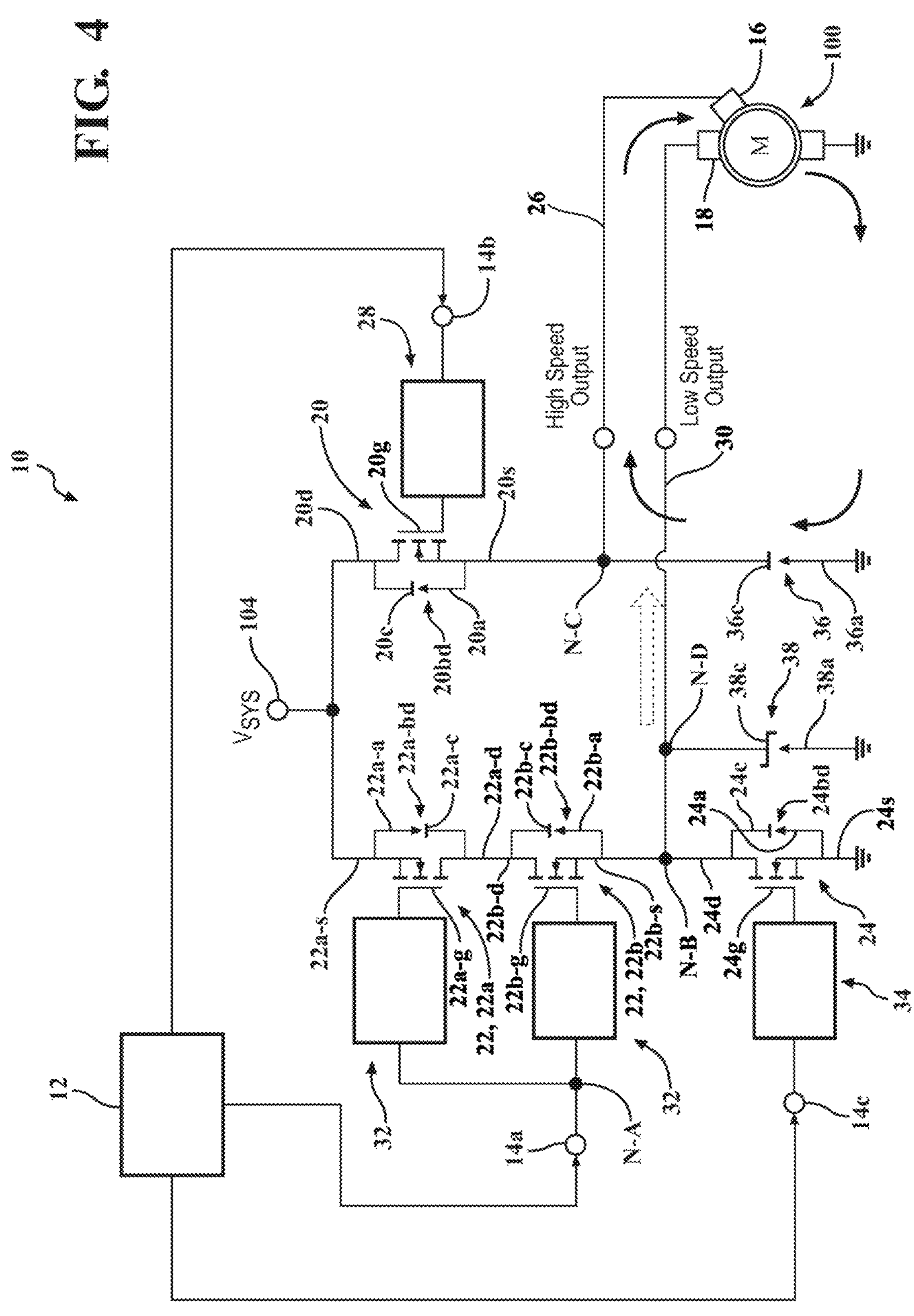
FIG. 4 is schematic view of the control circuit shown in FIG. 2 showing the second speed switch unit turned on and the first speed switch unit turned off.

With reference now to FIG. 4, the windshield wiper 106 is turned off after having operated in the high-speed mode. In one aspect, the motor control unit 12 may be configured to step down the operation of the windshield wiper motor 100, wherein the motor control unit 12 transmits a low-speed command 14*a* and then transmits a braking command 14*c*. In such an aspect, the first speed switch unit 20 is turned off and then the second switch 22*b* unit is turned on. Subsequent to the second switch 22*b* unit being turned on, the motor control unit 12 turns off the second switch 22*b* unit and issues the braking command 14*c*. As the windshield wiper motor 100 winds down from the high speed mode to the low speed mode, an induced current is generated by the motor and is allowed to dissipate in what is known in the art as a free-wheel circulation (as indicated by the arcuate arrows) wherein the induced current flows through the anode of the free-wheel diode, then through the cathode of the free-wheeling diode 36, through the first communication line 26, back into the first input 16 of the windshield wiper motor 100, and back through the anode of the free-wheeling diode 36 until the current is dissipated, thereby preventing potential damage to the first speed switch unit 20.

Figure 5:
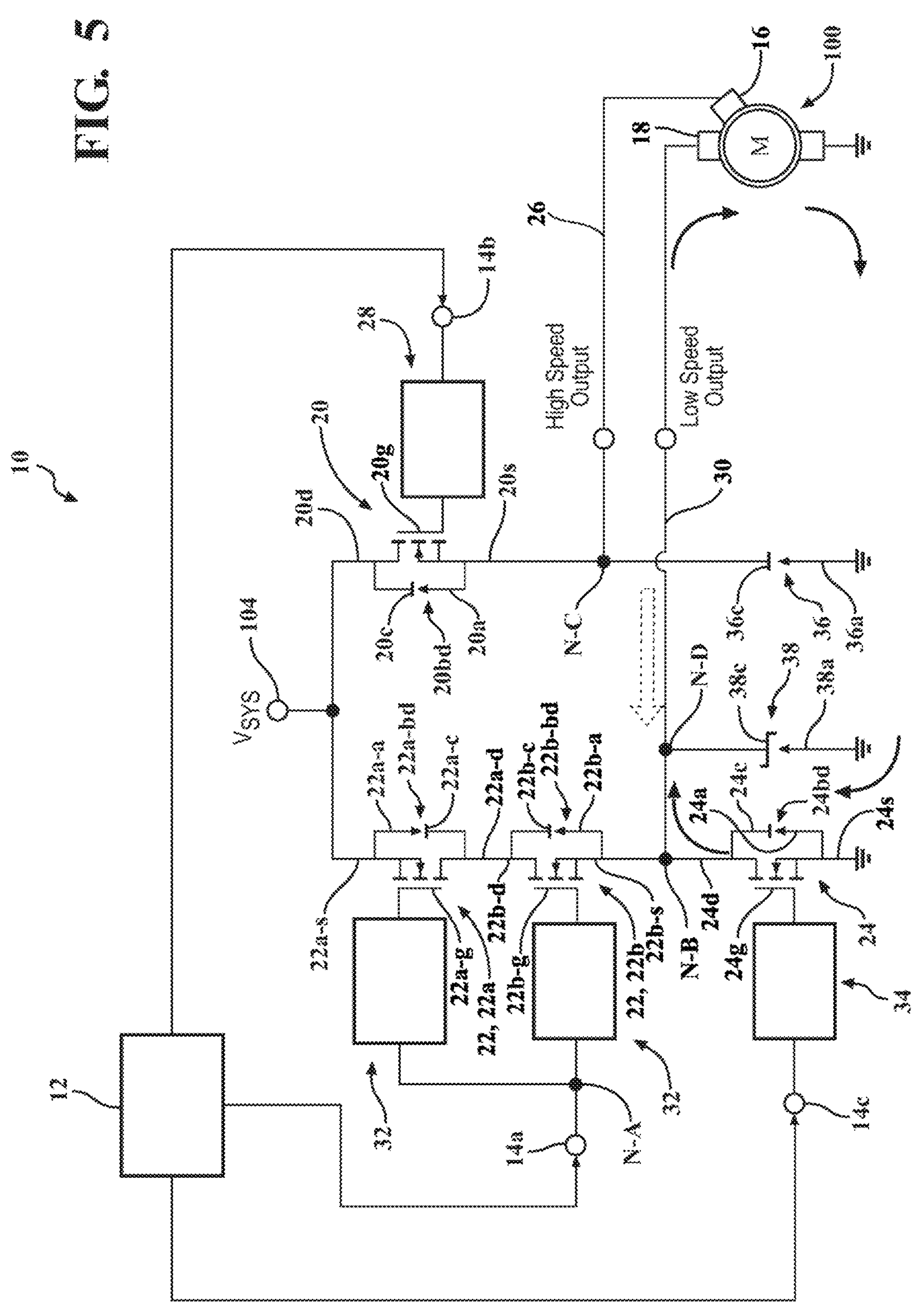
FIG. 5 is schematic view of the control circuit shown in FIG. 2 showing the second speed switch unit turned off, the braking switch unit turned on, and the first speed switch unit turned off.

With reference now to FIG. 5, the windshield wiper motor 100 is turned off from the high-speed mode. To turn off, the motor control unit 12 first winds down the windshield wiper motor 100 by transitioning to the low-speed mode, wherein the first speed switch unit 20 is turned off and the second speed switch unit 22 is turned on. When the windshield wiper motor 100 reaches a steady state, the motor control unit 12 turns off the second speed switch unit 22 and waits for a predetermined period of time sufficient to allow the speed switch unit 22 to transition from on to off states, and allows inductive current to free-wheel through the braking switch unit 24 body diode 24*bd*. After the predetermined period of time has passed, the motor control unit 12 transmits the brake command wherein the braking switch is turned on to provide a path for current to flow from the windshield wiper motor 100 to ground and stop the windshield wiper motor 100 from operating. It should be appreciated that the brake command includes instructions that stops the operation of the windshield wiper motor 100 to place the windshield wipers 106 in a parked position.

Figure 6:
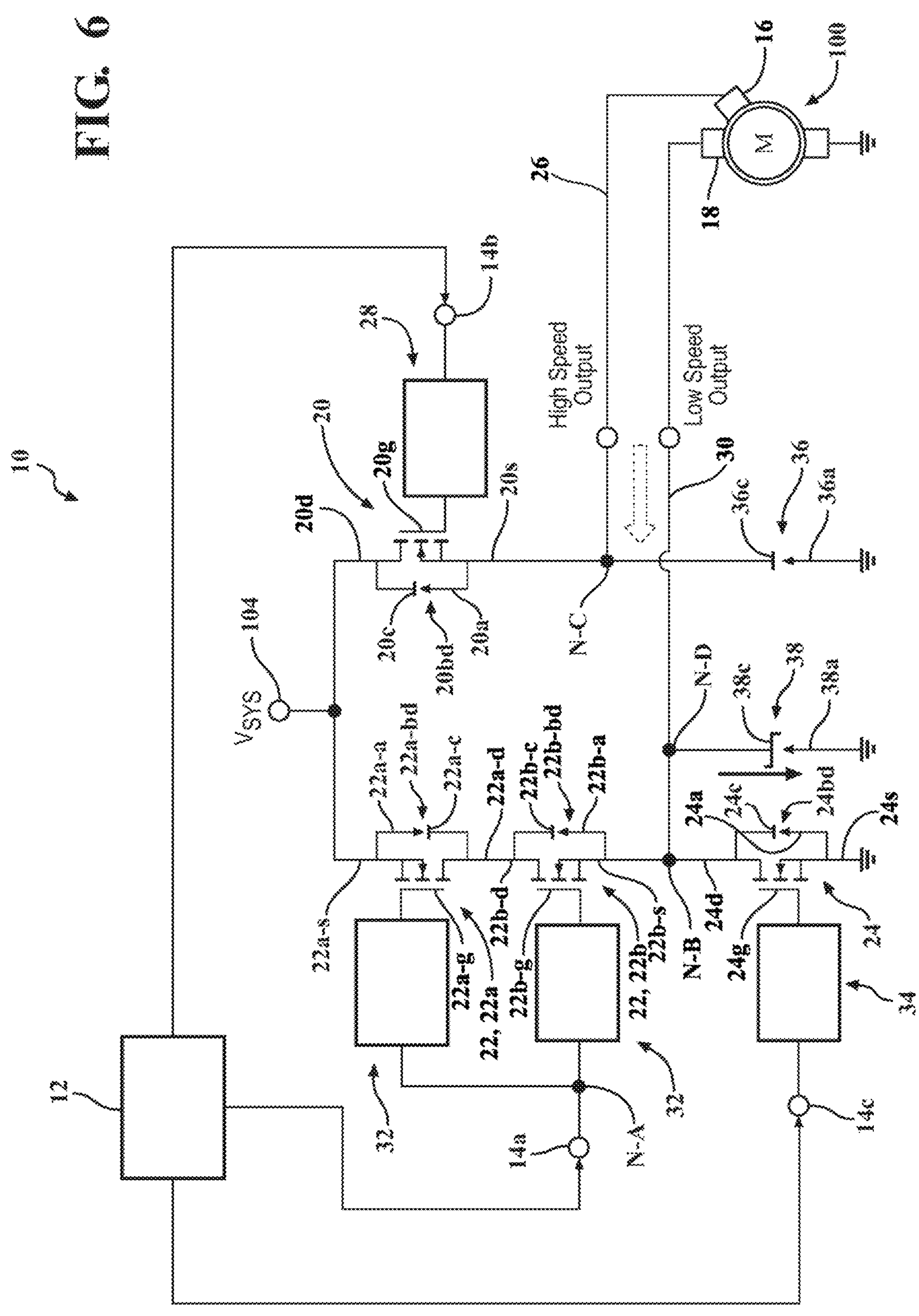
FIG. 6 is schematic view of the control circuit shown in FIG. 2 showing the second speed switch unit turned off and the braking switch unit turned on, then turned off prior to the reverse braking current being dissipated from the motor.

FIG. 6 illustrates an instance where the braking switch is inadvertently turned off prior to a completion of the complete wind down of the windshield wiper motor 100. This may be caused by a software glitch or loss of power to the control circuit 10 or motor control unit 12. During dynamic braking, the braking switch unit 24 is maintained in an on state which shorts the motor 100, thereby braking the motor 100. As the windshield wiper motor 100 is shorted, the windshield wiper motor 100 winds down and generates a current that may create an induced voltage surge if the braking circuit path is interrupted. Such a voltage surge would be capable of exceeding a voltage threshold of the braking switch unit 24. In the event that the braking switch unit 24 is turned off prior to completion of the wind down of the windshield wiper motor 100, the second communication line 30 is open at node N-B, which may damage the braking switch unit 24. However, at a voltage below the braking switch unit 24 threshold, the discharge diode 38 clamps down and discharges the current at node N-B to ground, as indicated by the solid arrow, thereby protecting the braking switch unit 24. In other aspects, a stall in the motor 100 occurring during a low or high-speed operation, will generate a stall current which the speed switch units 20 or 22 must withstand until the motor control unit detects the condition and commands the speed switch units 20 or 22 off. When the speed switch unit 20 or 22, as the case may be, is turned off, the motor current due to motor inductance free-wheels through the body diode 24*b* of the braking switch unit 24 for low-speed stall, or through the free-wheeling diode 36 for a high-speed stall. For example, a stall may occur when the wipers 106 are frozen in the middle of the windshield 110. In such an instance, when the windshield wiper motor 100 is commanded ON at low-speed, the windshield wiper motor 100 cannot rotate, drawing a large current from the battery 104. The motor control unit 12 monitors the "parking position" of the wipers 106, expecting to detect a parked signal within a predetermined time frame (such as 2-3 seconds). After the predetermined time frame has elapsed, the motor control unit 12 commands the second speed switch unit 22 OFF. However, inductance within the windshield wiper motor 100 keeps the current flowing into the second input 18 momentarily, which free-wheels though the ground and the body diode 24*b* of the braking switch unit 24.

A number of implementations have been described. Nevertheless, it will be understood that various modifications may be made without departing from the spirit and scope of the disclosure. Accordingly, other implementations are within the scope of the following claims.

The foregoing description has been provided for purposes of illustration and description. It is not intended to be exhaustive or to limit the disclosure. Individual elements or features of a particular configuration are generally not limited to that particular configuration, but, where applicable, are interchangeable and can be used in a selected configuration, even if not specifically shown or described. The same may also be varied in many ways. Such variations are not to be regarded as a departure from the disclosure, and all such modifications are intended to be included within the scope of the disclosure.

What is claimed is:

1. A control circuit operatively attached to a motor control unit configured to control an operation of a direct current (DC) motor powered by a battery, the motor includes a first input and a second input, and is configured to operate at a first speed and a second speed different than the first speed, the control circuit comprising:

- a first speed switch unit disposed on a first communication line and configured to connect the battery to the first input, wherein the first speed switch unit is a semiconductor switch;
- a second speed switch unit disposed on a second communication line, the second speed switch unit includes a first switch and a second switch and is configured to connect the battery to the second input, the second speed switch unit configured to block a current generated from a back electromotive force of the motor; and
- a braking switch unit connected to the second communication line and interposed between the second speed switch unit and the second input, the braking switch unit configured to connect the motor to a ground so as to stop the motor from operating.

2. The control circuit as set forth in claim 1, wherein the first switch and the second switch are semiconductor switches.

3. The control circuit as set forth in claim 1, further including a free-wheeling diode connected to the first communication line and in parallel with the motor, the free-wheeling diode configured to dissipate current through the second input of the motor.

4. The control circuit as set forth in claim 1, further including a discharge diode, the discharge diode disposed on the second communication line and interposed between the braking switch unit and the motor, the discharge diode configured to discharge current at a predetermined voltage.

5. The control circuit as set forth in claim 1, wherein the first speed switch unit and the second speed switch unit are each operatively connected to a high-side gate driver, and the braking switch unit is operatively connected to a low-side gate driver.

6. The control circuit as set forth in claim 1, further comprising a discharge diode having a cathode coupled to the second communication line between the braking switch unit and the second input and an anode coupled to ground, the discharge diode being configured to clamp and discharge current at a predetermined voltage to protect the braking switch unit from a voltage surge.

7. The control circuit as set forth in claim 2, wherein a polarity of the first switch is the opposite of a polarity of the second switch.

8. The control circuit as set forth in claim 4, wherein the discharge diode is a transient-voltage-suppression diode.

9. The control circuit as set forth in claim 7, wherein the first switch is interposed between the battery and the second switch.

10. The control circuit as set forth in claim 9, wherein the first switch includes a first diode and an anode of the first diode is interposed between the battery and a cathode of the first diode and wherein the second switch includes a second diode and an anode of the second diode is interposed between a cathode of the second diode and the motor.

11. A control circuit for controlling an operation of a two-speed DC motor having three brushes, the two-speed DC motor having a first input and a second input and configured to operate at a first speed and a second speed different than the first speed, the two-speed DC motor powered by a battery, the control circuit comprising:

a first speed switch unit disposed on a first communication line and configured to connect the battery to the first input;

a second speed switch unit disposed on a second communication line and configured to connect the battery to the second input, the second speed switch unit including a first switch and a second switch, wherein a polarity of the first switch is the opposite of a polarity of the second switch;

a braking switch unit connected to the second communication line and interposed between the second speed switch unit and the second input, the braking switch unit configured to connect the two-speed DC motor to a ground to stop an operation of the two-speed DC motor;

a free-wheeling diode connected to the first communication line and in parallel with the two-speed DC motor, the free-wheeling diode configured to dissipate current through the second input of the two-speed DC motor; and a discharge diode disposed on the second communication line and interposed between the braking switch unit and the two-speed DC motor, the discharge diode configured to discharge a predetermined voltage to protect the braking switch unit from a voltage surge of the two-speed DC motor, wherein one of the braking switch unit and the discharge diode is further configured to dissipate current along the second communication line.

12. The control circuit as set forth in claim 11, wherein the first speed switch unit, the first switch, the second switch, and the braking switch unit are semiconductor switches, and each of the first speed switch unit, the first switch, and the second switch is operatively connected to a high side gate driver and the braking switch unit is operatively connected to a low side gate driver.

13. The control circuit as set forth in claim 12, wherein the first switch includes a first diode and an anode of the first diode is interposed between the battery and a cathode of the first diode and wherein the second switch includes a second diode and an anode of the second diode is interposed between a cathode of the second diode and the two-speed DC motor.

14. The control circuit as set forth in claim 13, wherein the discharge diode is a transient-voltage-suppression diode.

15. A control circuit operatively coupled to a motor control unit configured to generate control signals for operating a windshield wiper motor, the control signals including a low-speed command, a high-speed command, and a brake command, the windshield wiper motor powered by a battery, the windshield wiper motor having three brushes and configured to operate at a low speed when the low-speed command is transmitted, a high speed when the high-speed command is transmitted, and brake when the brake command is transmitted, the windshield wiper motor includes a first input for receiving the high-speed command and a second input for receiving the low-speed command and the brake command, the control circuit comprising:

a first speed switch unit disposed on a first communication line and configured to connect the battery to the first input when the high-speed command is transmitted;

a second speed switch unit disposed on a second communication line and configured to connect the battery to the second input when the low-speed command is transmitted, the second speed switch unit including a first switch and a second switch, wherein a polarity of the first switch is the opposite of a polarity of the second switch;

a braking switch unit connected to the second communication line and interposed between the second speed switch unit and the second input, the braking switch unit configured to connect the windshield wiper motor to a ground upon receiving the brake command;

a free-wheeling diode connected to the first communication line and in parallel with the windshield wiper motor, the free-wheeling diode configured to dissipate current through the second input of the windshield wiper motor; and a discharge diode disposed on the second communication line and interposed between the braking switch unit and the windshield wiper motor, the discharge diode configured to discharge current at a predetermined voltage to protect the braking switch unit from a larger surge voltage.

16. The control circuit as set forth in claim 15, wherein the first speed switch unit, the first switch, and the second switch are a semiconductor switches.

17. The control circuit as set forth in claim 16, wherein the first switch is interposed between the battery and the second switch.

18. The control circuit as set forth in claim 17, wherein the first speed switch unit, the first switch, the second switch, and the braking switch unit are semiconductor switches, wherein each of the first speed switch unit, the first switch, and the second switch is operatively connected to a high side gate driver and the braking switch unit is operatively connected to a low side gate driver.

19. The control circuit as set forth in claim 18, wherein the first switch includes a first diode and an anode of the first diode is interposed between the battery and a cathode of the first diode and wherein the second switch includes a second diode and an anode of the second diode is interposed between a cathode of the second diode and the windshield wiper motor.

20. The control circuit as set forth in claim 19, wherein the discharge diode is a transient-voltage-suppression diode.

* * * * *